(12) United States Patent
Kim

(10) Patent No.: US 11,469,320 B2
(45) Date of Patent: Oct. 11, 2022

(54) HIGH VOLTAGE SEMICONDUCTOR DEVICE HAVING BOOTSTRAP DIODE

(71) Applicant: KEY FOUNDRY CO., LTD., Cheongju-si (KR)

(72) Inventor: Young Bae Kim, Sejong-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 78 days.

(21) Appl. No.: 17/107,185

(22) Filed: Nov. 30, 2020

(65) Prior Publication Data

US 2022/0037525 A1 Feb. 3, 2022

(30) Foreign Application Priority Data

Jul. 29, 2020 (KR) .................. 10-2020-0094187

(51) Int. Cl.
| | | |
|---|---|---|
| *H01L 29/00* | (2006.01) | |
| *H01L 29/78* | (2006.01) | |
| *H01L 29/861* | (2006.01) | |
| *H01L 29/06* | (2006.01) | |

(52) U.S. Cl.
CPC ...... *H01L 29/7818* (2013.01); *H01L 29/0623* (2013.01); *H01L 29/0688* (2013.01); *H01L 29/8611* (2013.01); *H01L 29/8613* (2013.01)

(58) Field of Classification Search
CPC ............. H01L 29/0688; H01L 29/0623; H01L 29/7835; H01L 29/7818; H01L 29/8611; H01L 29/8613
See application file for complete search history.

(56) References Cited

U.S. PATENT DOCUMENTS

| | | |
|---|---|---|
| 6,507,085 B2 | 1/2003 | Shimizu |
| 6,825,700 B2 | 11/2004 | Hano |
| 7,309,894 B2 | 12/2007 | Jeon et al. |
| 7,518,209 B2 | 4/2009 | Kim et al. |
| 8,217,487 B2 | 7/2012 | Choi et al. |
| 8,957,475 B2 | 2/2015 | Moon |
| 9,947,742 B2 | 4/2018 | Kim et al. |
| 9,947,786 B2 | 4/2018 | Kim et al. |
| 10,312,322 B2 | 6/2019 | Kim et al. |
| 10,566,465 B2 | 2/2020 | Pang et al. |
| 10,923,603 B2 | 2/2021 | Pang et al. |

(Continued)

FOREIGN PATENT DOCUMENTS

| | | |
|---|---|---|
| KR | 10-0780967 B1 | 12/2007 |
| KR | 10-2014-0113772 A | 9/2014 |

(Continued)

OTHER PUBLICATIONS

Korean Office Action dated Jun. 15, 2021 in counterpart Korean Patent Application No. 10-2020-0094187 (9 pages in Korean).

*Primary Examiner* — Reema Patel
(74) *Attorney, Agent, or Firm* — NSIP Law

(57) ABSTRACT

A semiconductor device includes a source region and a drain region formed in a substrate and having different conductivity types, an insulating film formed between the source region and the drain region, a deep well region formed under the insulating film, and a pinch-off region formed under the insulating film and having a same conductivity type as the deep well region, wherein a depth of a bottom surface of the pinch-off region is different from a depth of a bottom surface of the deep well region.

27 Claims, 9 Drawing Sheets

(56) References Cited

U.S. PATENT DOCUMENTS

2008/0135970 A1 6/2008 Kim et al.
2016/0293758 A1* 10/2016 Kim .................. H01L 29/41758

FOREIGN PATENT DOCUMENTS

| KR | 10-2016-0119410 A | 10/2016 |
| KR | 10-2017-0059706 A | 5/2017 |
| KR | 10-2019-0038717 A | 4/2019 |

* cited by examiner

HIGH VOLTAGE SEMICONDUCTOR DEVICE HAVING BOOTSTRAP DIODE

CROSS-REFERENCE TO RELATED APPLICATIONS

This application claims the benefit under 35 U.S.C. 119(a) of Korean Patent Application No. 10-2020-0094187 filed on Jul. 29, 2020 in the Korean Intellectual Property Office, the entire disclosure of which is incorporated herein by reference for all purposes.

BACKGROUND

1. Field

The following description relates to a high voltage semiconductor device. The following description further relates to a high voltage semiconductor device having a bootstrap diode.

2. Description of Related Art

A bootstrap circuit may be used for stable operation of a high voltage device such as a high voltage MOSFET in a high voltage integrated circuit (HVIC). The bootstrap circuit may use a diode and a capacitor in order to charge the capacitor instantaneously, by applying sufficient voltage to the gate of the high voltage MOSFET to operate the high voltage MOSFET. When such a bootstrap circuit is to be integrated together into a high voltage IC HVIC, a bootstrap diode having a withstanding voltage of about 600 V or more may be used in the bootstrap circuit. This bootstrap diode may help the HVIC to operate stably while also having a high withstanding voltage.

Typically, a structure in which a PN diode is formed together in a JFET structure may be developed to make a bootstrap diode that has a high withstanding voltage. As a result, PN diodes provided externally may be provided directly in an HVIC, thereby contributing to a reduction in manufacturing cost and in module size. However, there may be an issue that the PN diode and the JFET structure that are provided in order to satisfy the high withstanding voltage in the HVIC may occupy a very large area in the chip. In addition, there may be an issue that it may be difficult to design the pinch-off voltage of the PN diode for bootstrapping appropriately.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a source region and a drain region formed in a substrate and having different conductivity types, an insulating film formed between the source region and the drain region, a deep well region formed under the insulating film, and a pinch-off region formed under the insulating film and having a same conductivity type as the deep well region, wherein a depth of a bottom surface of the pinch-off region is different from a depth of a bottom surface of the deep well region.

The pinch-off region may be formed to be in contact with the deep well region, an amount of current between the source region and the drain region may be adjusted based on a form of the pinch-off region, and the depth of the bottom surface of the pinch-off region may be smaller than the depth of the bottom surface of the deep well region.

A dopant concentration of the pinch-off region may be smaller than a dopant concentration of the deep well region.

The source region may have a P-type conductivity type, and the drain region may have an N-type conductivity type, such that the source region and the drain region may form a PN diode.

The semiconductor device may further include a body region surrounding the source region, and an isolation well region surrounding the PN diode.

The semiconductor device may further include first and second N-type doped regions formed in the body region and a third N-type doped region formed in the deep well region, and formed to be near the second N-type doped region, wherein the second N-type doped region and the third N-type doped region may be electrically connected to each other.

The semiconductor device may further include first and second deep trench structures surrounding the body region.

The semiconductor device may further include first and second isolation P-type well regions surrounding the body region.

The semiconductor device may further include a buried layer having a same conductivity type as a conductivity type of the source region, and formed between the pinch-off region and the insulating film, wherein a depth of the pinch-off region may be smaller than a depth of the buried layer.

The semiconductor device may further include a gate region penetrating the buried layer, wherein the gate region overlaps the pinch-off region.

The semiconductor device may further include a first N-type buried layer and a second N-type buried layer, wherein the first N-type buried layer may overlap the source region and the second N-type buried layer may overlap the drain region.

The semiconductor device may further include a first field plate connected to the source region and a second field plate connected to the drain region.

The semiconductor device may further include a low voltage region and a high voltage region formed in the substrate, and an LDMOS device formed between the low voltage region and the high voltage region and including an N-type source region and an N-type drain region formed in the substrate, a gate electrode formed between the N-type source region and the N-type drain region, and a P-type body region surrounding the N-type source region.

The deep well region may include a first deep well region and a second deep well region formed to be spaced apart from each other, and the pinch-off region may be located between the first and second deep well regions.

The semiconductor device may further include a P-type doped region and an N-type doped region formed between the source region and the insulating film, and a floating metal wiring formed on the P-type and the N-type doped regions.

The semiconductor device may further include a P-type doped region formed between the source region and the insulating film, an N-type polysilicon formed on the insulating film, and a floating metal wiring connecting the P-type doped region and the N-type polysilicon.

In another general aspect, a semiconductor device includes a first deep well region and a second deep well region formed in a substrate, a diffusion region formed between the first and second deep well regions, a P-type source region formed in the first deep well region, an N-type drain region formed in the second deep well region, and a buried layer formed between the P-type source region and the N-type drain region, wherein the diffusion region is formed under the buried layer, and a depth of a bottom surface of the diffusion region is different from a depth of a bottom surface of the second deep well region formed under the buried layer.

The diffusion region may be formed to be in contact with the deep well region, an amount of current between the P-type source region and the N-type drain region may be adjusted by the diffusion region, and a depth of the diffusion region may be smaller than a depth of the second deep well region formed under the buried layer.

A dopant concentration of the diffusion region may be smaller than a dopant concentration of the second deep well region.

The P-type source region and the N-type drain region may form a PN diode.

The semiconductor device may further include a body region surrounding the P-type source region, and an isolation well region surrounding the PN diode.

The semiconductor device may further include an insulating film formed between the P-type source region and the N-type drain region, wherein a depth of the diffusion region formed under the insulating film may be smaller than a depth of the second deep well region formed under the insulating film.

The semiconductor device may further include a gate region penetrating the buried layer, wherein the gate region overlaps the diffusion region.

In another general aspect, a semiconductor device includes a source region and a drain region formed in a substrate, an insulating film formed between the source region and the drain region, a deep well region formed under the insulating film, and a pinch-off region formed under the insulating film and having a same conductivity type as the deep well region, wherein a depth of a bottom surface of the pinch-off region is smaller than a depth of a bottom surface of the deep well region.

The source region and the drain region may have different conductivity types.

The pinch-off region may be formed to be in contact with the deep well region, wherein an amount of current between the source region and the drain region may be adjusted based on a form of the pinch-off region.

A dopant concentration of the pinch-off region may be smaller than a dopant concentration of the deep well region.

The source region may have a P-type conductivity type, and the drain region may have an N-type conductivity type, such that the source region and the drain region may form a PN diode.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
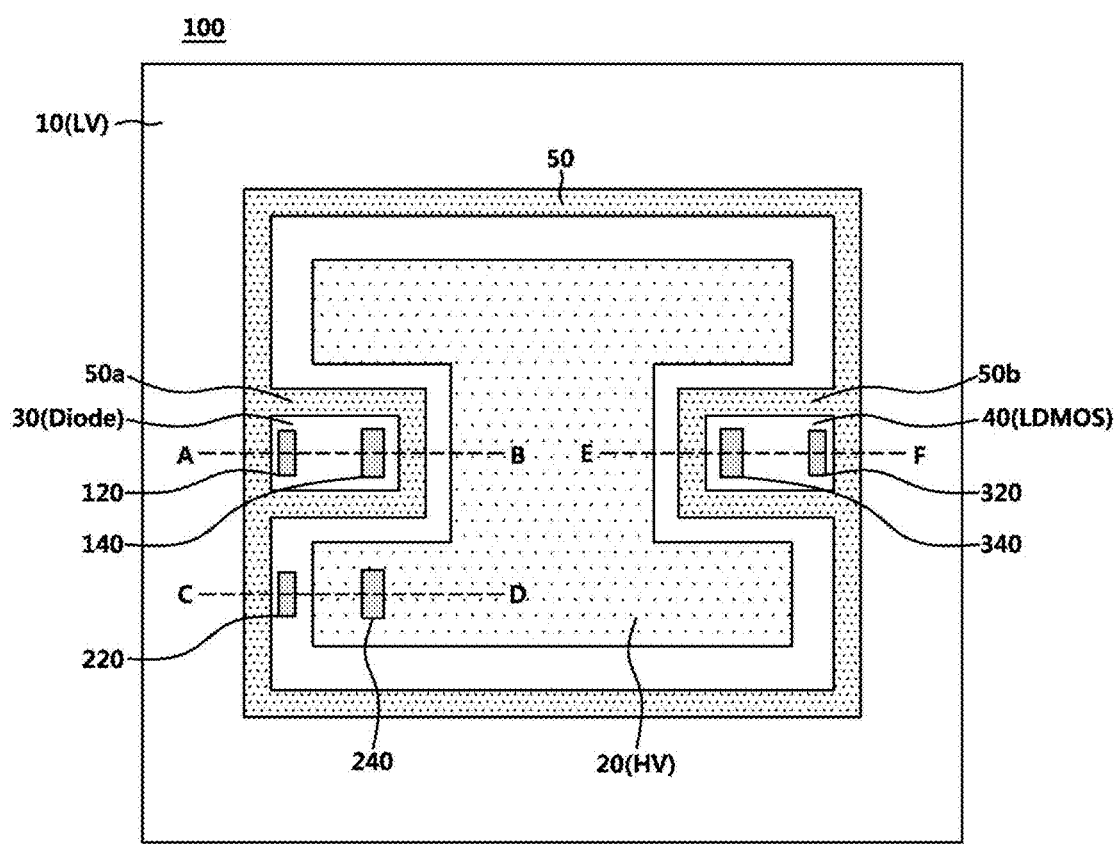
FIG. 1 is a plan view of a high voltage semiconductor device, according to one or more examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Terms such as "including" or "comprising" used in the embodiments should not be construed as necessarily including all of various components, or various operations described in the specification, and it should be construed that some of the components or some of the operations may not be included or may further include additional components or operations.

The use of the term "may" herein with respect to an example or embodiment (e.g., as to what an example or embodiment may include or implement) means that at least one example or embodiment exists where such a feature is included or implemented, while all examples are not limited thereto.

Objects and effects, and technical configurations for achieving them of the present disclosure are apparent with reference to the examples described below in detail with the accompanying drawings. In describing the present disclosure, when it is judged that a detailed description of a known function or configuration may unnecessarily obscure the subject matter of the present disclosure, the detailed description thereof is omitted.

The following terms are defined in consideration of functions in the present disclosure, which may vary depending on the user, intention or custom of the operator.

However, the present disclosure is not limited to the examples disclosed below, but may be implemented in various forms. The present examples are merely provided to complete the disclosure of the present disclosure and to fully inform those skilled in the art the scope of the present disclosure, and the present disclosure is defined by the scope of the claims. Therefore, the definition should be made with respect to the contents throughout the specification.

Accordingly, the present examples provide for a high voltage semiconductor device that may implement a bootstrap diode using a JFET structure in order to minimize the area of the chip and to have a high withstanding voltage bootstrap diode.

In another general aspect, the present examples may provide for a high voltage semiconductor device having a bootstrap diode that may easily adjust a pinch-off voltage of a bootstrap diode by using a JFET structure.

Subsequently, the present examples are described in further detail with respect to the examples illustrated in the drawings, which are not to be taken as being limiting.

FIG. 1 is a plan view of a high voltage semiconductor device HVIC, according to one or more examples.

As illustrated in FIG. 1, the high voltage semiconductor device 100 may include a first region (low voltage region) 10 operating at a low voltage, a second region (high voltage region) 20 operating at a high voltage, a high withstanding voltage diode 30, an LDMOS device 40, and a junction isolation region 50 disposed between the low voltage region 10 and the second region 20, according to a non-limiting example. The low voltage region 10 may operate at an operating voltage less than 20 V, and the high voltage region 20 may operate at an operating voltage ranging from 200 to 1010 V.

The high withstanding voltage diode 30 may be formed between the low voltage region 10 and the high voltage region 20, an area which is surrounded by junction isolation regions 50 and 50a. For example, such a high withstanding voltage diode may be a bootstrap diode. The high withstanding voltage diode 30 may have a fixed area in an example, but the area may also be designed differently according to an area of the high voltage region in other examples.

The high withstanding voltage diode 30 may include a P-type source region 120 and an N-type drain region 140, according to a non-limiting example. In such an example, the P-type source region 120 may be formed by an ion implantation using highly doped P-type dopants. Also, in such an example, the N-type drain region 140 may be formed by an ion implantation using highly doped N-type dopants. Therefore, the source region 120 and the drain region 140 may be formed using dopants that have different conductivity types. Thus, the high withstanding voltage diode 30 may also be referred to, alternatively, as the PN diode 30. In addition, the P-type source region 120 and the N-type drain region 140 may be referred to as an anode electrode 120 and a cathode electrode 140, respectively.

An LDMOS device 40 may also be formed between the low voltage region 10 and the high voltage region 20, in an area that is surrounded by junction isolation regions 50 and 50b. The LDMOS device 40 may include an N-type source region 320 and an N-type drain region 340. In such an example, both of the N-type source/drain regions 320 and 340 may be the regions ion-implanted with high concentration N-type dopants. The LDMOS device 40 may serve as a level shifter that transfers the signal of the low voltage region 10 to the high voltage region 20, or conversely, transfers the signal of the high voltage region 20 to the low voltage region 10. Instead of such an LDMOS device 40, an EDMOS, an DMOS, and/or a lateral high voltage device may be included in other examples. In addition, the LDMOS device 40 may be designed to have a high breakdown voltage (BV). This design may be used because a high voltage of 200 to 1010 V may be applied to the drain region 340 of the LDMOS device 40, as discussed above.

The junction isolation regions 50, 50a, and 50b may be regions for electrically isolating the low voltage region 10 from the high voltage region 20. Although the junction isolation regions 50, 50a, and 50b are described along with the junction structure as a non-limiting example, the junction isolation regions 50, 50a, and 50b may also be formed with a deep trench structure, according to other examples. The junction isolation regions 50, 50a, and 50b may further include a P-type doped region 220. The P-type doped region 220 may be formed by an ion-implantation using highly doped P-type dopants.

In FIG. 1, the high withstanding voltage diode 30 and the LDMOS device 40 are illustrated as being located opposite to each other, but this is only an example. Other examples may be designed by changing the location of these elements.

The high voltage region 20 may further include a high voltage N-type doped region 240 that is formed by an ion-implantation by using highly doped N-type dopants. The high voltage N-type doped region 240 may be disposed in the high voltage well region 202 of FIG. 5.

Figure 2A:
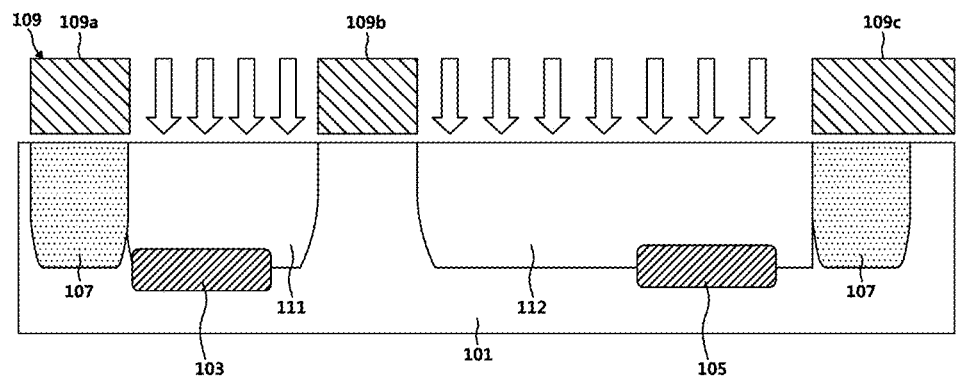
FIGS. 2A-2C illustrate a process of forming a pinch-off region of a high withstanding voltage diode, according to one or more examples.
Figure 2B:
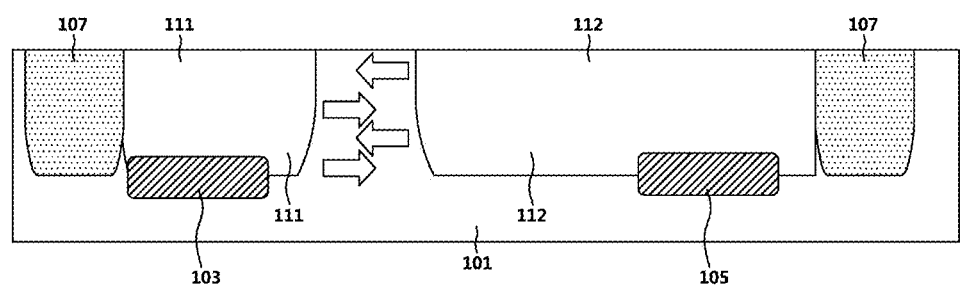
Figure 2C:
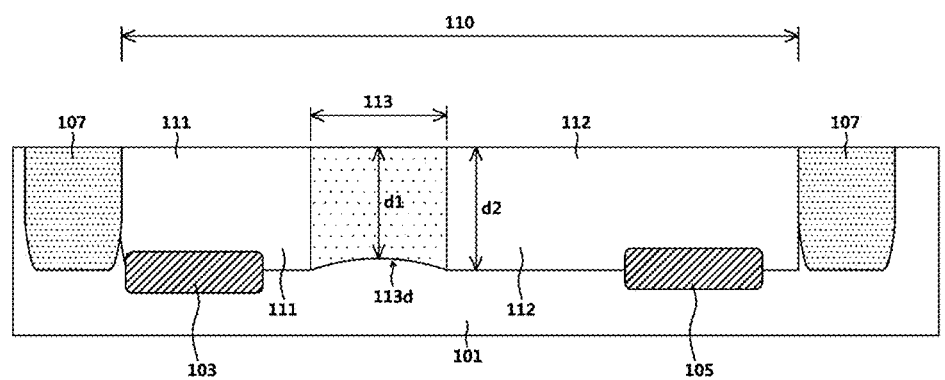

FIGS. 2A-2C illustrates a process of forming a pinch-off region of a high withstanding voltage diode, according to one or more examples.

As illustrated in FIG. 2A, a first N-type buried layer NBL 103 and a second N-type buried layer 105 may be formed on the substrate 101. Then, mask patterns 109, 109a, 109b, 109c, each having a predetermined width, may be formed on the substrate 101. Impurity ions of a first conductivity type may be implanted in the direction of the arrows into the substrate 101 exposed by the mask patterns 109a, 109b, and 109c. The first N-type deep well region 111 and the second N-type deep well region 112 may be doped at the same impurity concentration and depth. Under the mask patterns 109a, 109b, 109c, there may be no implanted dopants into the substrate 101. However, there may be an empty space between the first N-type deep well region 111 and the second N-type deep well region 112. A width of the space S may depend on a length or width of the mask pattern 109b. The longer the width of the mask pattern 109b is, the greater the space S between the first N-type deep well region 111 and the second N-type deep well region 112 may be. As the space S between the first N-type deep well region 111 and the second N-type deep well region 112 increases, the first N-type deep well region 111 and the second N-type deep well region 112 may be formed to be apart from each other. In addition, each dopant of the first N-type deep well region 111 and the second N-type deep well region 112 may diffuse together with each other during a high temperature drive-in annealing process. The farther away the first N-type deep well region 111 and the second N-type deep well region 112 are from each other, the smaller the amount of dopants may diffuse into the empty space, so that the depth and concentration of the diffusion region 113 may decrease in the space. This example may occur because the larger the space S, the smaller the number of dopants that diffuse per unit volume.

The concentration of the diffusion region 113 that is formed subsequently may be determined by the width of the mask pattern 402.

As illustrated in FIG. 2B, the mask patterns 109a, 109b, and 109c may be removed. In addition, the drive-in annealing thermal process may be performed at a high temperature, such as 1000-1200° C. Each dopant of the first N-type deep well region 111 and the second N-type deep well region 112 may diffuse into the substrate 101. That is, impurities of the first conductivity type may diffuse in directions that face each other.

Thus, as illustrated in FIG. 2C, an N-type diffusion region 113 may be formed between the first N-type deep well region 111 and the second N-type deep well region 112. A concave groove or dip or curved shape 113d may also be formed at a bottom surface of the diffusion region 113 by the diffusion process. The diffusion region 113 may later serve as a pinch-off region. This example is achieved because a depth d1 of the diffusion region 113 may be thinner than a depth d2 of the first N-type deep well region 111 or the second N-type deep well region 112.

A depth or concentration of the diffusion region 113 may affect a pinch-off voltage of the PN diode 30. For example, in junction field-effect transistors (JFETs), the term "pinch-off" refers to the threshold voltage below which the transistor turns off. Thus, the longer the width of the mask pattern 109b, the shallower the depth d1 of the groove or dip 113d may be, accordingly. This result occurs because the longer the width of the mask pattern 109b, the less the amount of dopant diffuses, as a result. In such an example, the pinch-off voltage decreases, accordingly. This result occurs because the thickness of the diffusion region 113 becomes thin, so that a depletion region may be easily formed even at a low voltage reverse bias condition.

However, the shorter the width of the mask pattern 109b, the greater the amount of dopants that may diffuse, and the vertical thickness d1 of the diffusion region 113 may become thick, so that the pinch-off voltage may be increased. This result occurs because a higher reverse bias voltage may be required for forming a depletion region.

Figure 3:
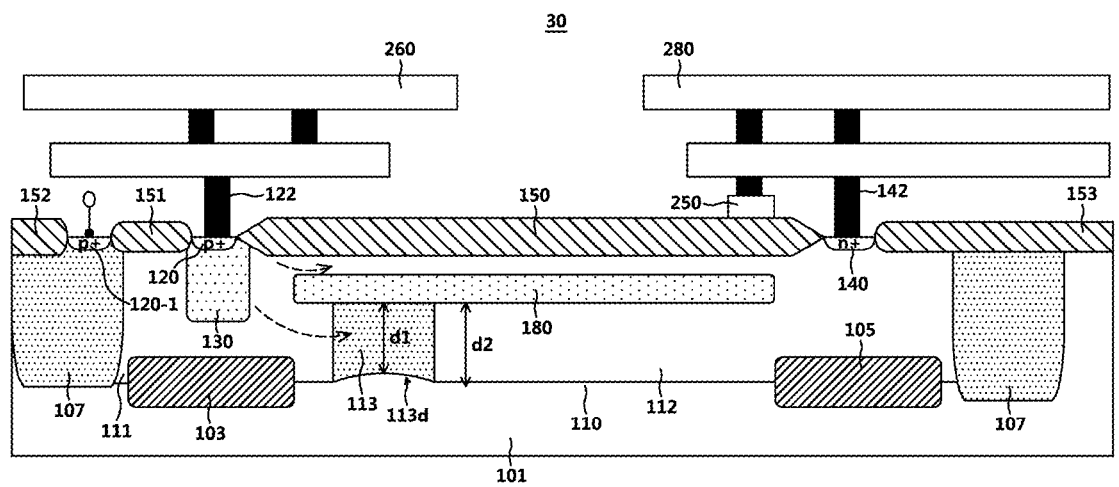
FIG. 3 is a cross-sectional view of a high withstanding diode, according to one or more examples.

The diffusion region 113 may be a region formed by mutual diffusion of dopants from the first N-type deep well region 111 and the second N-type deep well region 112. Thus, the diffusion region 113 may have a lower impurity concentration than that of the first N-type deep well region 111 and the second N-type deep well region 112. Therefore, the depth/thickness of the diffusion region 113 with respect to the substrate surface may be d1, which may be smaller than the depth d2 of the second N-type deep well region 112. The value of the depth/thickness d1 of the diffusion region 113 may be changed in differing areas because the bottom surface of the diffusion region 113 is curved. In such an example, d1 may define the thinnest depth/thickness of the diffusion region 113. Accordingly, the diffusion region 113 may correspond to where the pinch-off region 113 is formed. The bottom surface of the diffusion region 113 may have a curved shape, according to a non-limiting example. In addition, the bottom surface of the diffusion region 113 may be formed to be lower than the bottom surfaces of the first N-type deep well region 111 and the second N-type deep well region 112. The diffusion region 113, the first N-type deep well region 111, and the second N-type deep well region 112 may be merged into a single N-type deep well region 110, according to such a non-limiting example. In addition, a P-type buried layer PBL 180, such as is shown in FIG. 3, may be formed in the single N-type deep well region 110. In such an example, the depth/thickness d1 of the diffusion region 113 may be decreased.

A P-type isolation well region 107 may be formed in the substrate 101. The P-type isolation well region 107 may surround the first N-type deep well region 111 and the second N-type deep well region 112, where the first N-type deep well region 111 and the second N-type deep well region 112 are components of the high withstanding voltage diode 30. The high withstanding voltage diode 30 may be electrically isolated from the peripheral devices by the presence of the P-type isolation well region 107. Thus, the P-type isolation well region 107 may refer to the junction isolation regions 50, 50a, and 50b, as illustrated in FIG. 1. That is, the junction isolation regions 50, 50a, and 50b may correspond to the P-type isolation well region 107.

FIG. 3 is a cross-sectional view taken along line A-B of the high voltage diode illustrated in FIG. 1, according to one or more examples.

As illustrated in FIG. 3, the high withstanding voltage diode 30 may include first and second N-type buried layers, hereinafter referred to as NBL 103 and 105 on the substrate 101. The first and second NBL 103 and 105 may have an effect of preventing the formation of a parasitic NPN. The first and second NBL 103 and 105 may be mainly formed on the interface of the N-type deep well region 110 and the substrate 101. In such an example, the N-type deep well region 110 may include a first N-type deep well region or first DNW 111 and a second N-type deep well region or second DWN 112. Thus, the first NBL 103 may be formed at an interface between the first N-type deep well region or first DNW 111 and the substrate 103. The second NBL 105 may be formed at an interface between the second N-type deep well region or second DWN 112 and the substrate 101. The first and second NBL 103 and 105 may have higher doping concentrations than the first and second N-type deep well regions 111 and 112, according to such a non-limiting example.

As illustrated in FIG. 3, the high withstanding voltage diode 30 may include an N-type deep well region 110 formed on the substrate 101. The N-type deep well region 110 may include the first N-type deep well region 111 or a first DNW, the second N-type deep well region 112 or a second DNW, and the pinch-off region or diffusion region 113. For example, the area of the second N-type deep well region 112 may be relatively greater than that of the first N-type deep well region 111. This feature is used to increase the resistance of the second N-type deep well region 112. For example, a depth d1 of the pinch-off region 113 may be shallower than a depth d2 of the second N-type deep well region 112.

The pinch-off region 113 may be formed by diffusion of the first N-type deep well region 111 and the second N-type deep well region 112, as shown in FIGS. 2A-2C. That is, the first N-type deep well region 111 and the second N-type deep well region 112 may be formed by ion-implantations with the same N-type impurity concentration. The pinch-off region 113 having a concave groove or dip 113d may be formed by the diffusion of dopants that originate from the deep well regions 111 and 112. The amount of forward current of the diode 30 may depend on the depth d1 of the pinch-off region 113. In FIG. 3, the pinch-off region 113 may have a depth or thickness d1 with respect to the P-type buried layer 180, hereinafter, PBL. Here, d1 may also denote as a distance between the PBL 180 and the substrate 101. The d2 of the second N-type deep well region 112 may also denote a distance between the PBL 180 and the substrate 101. Therefore, the depth of the diffusion region 113 with respect to the PBL 180 is d1, which is smaller than d2, in the present non-limiting example. The greater the depth d1 between the PBL 180 and the substrate 101, the higher the pinch-off voltage is as a result. In addition, the larger the area of the pinch-off region 113, the greater the amount of current flowing into the drain region as a result. In addition, the smaller the depth d1 between the PBL 180 and the substrate 101, the lower the pinch-off voltage is as a result. In addition, because the depth/thickness of the pinch-off region may be thin, the amount of current flowing into the drain region may be small as a result. Thus, by adjusting the depth d1 between the PBL 180 and the substrate 101, various pinch-off voltage values and current amounts desired by the customer may be implemented accordingly. That is, the depth or thickness d1 of the pinch-off region 113 may be formed differently, according to the pinch-off voltage of the desired diode. The method of adjusting the depth or thickness d1 is described in greater detail in FIG. 2.

In the present non-limiting example, the PBL 180 may be doped with P-type impurities, and may be formed in a horizontal direction of the bottom surface of the insulating film 150 by being spaced apart at a predetermined distance from the bottom surface of the insulating film 150. However, the PBL 180 may be formed to be in contact with the insulating film 150, in a non-limiting example. In another example, two or more PBLs 180 may be formed to be spaced apart from each other in the vertical direction of the substrate surface. The PBL 180 may have an effect of helping the depletion region to be easily formed in the N-type deep well region 110 in a state where a reverse-bias voltage is applied.

In summary, the bottom surface of the diffusion region 113 or the pinch-off region 113 may be at a depth different from a depth of the bottom surface of the N-type deep well region 110 or the second deep well region 112 located under the insulating film 150. Accordingly, the depth/thickness of the diffusion region 113 or the pinch-off region 113 may be smaller than the depth/thickness of the bottom surface of the N-type deep well region 110 or the second deep well region 112 with respect to the under the insulating film 150. Similarly, the bottom surface of the diffusion region 113 or the pinch-off region 113 may be at a depth different from a depth of the bottom surface of the N-type deep well region 110 or the second deep well region 112 located under the PBL 180. With respect to the structure under the PBL 180, the depth/thickness of the diffusion region 113 or the pinch-off region 113 may be smaller than the depth/thickness of the bottom surface of the N-type deep well region 110 or the second deep well region 112.

Additionally, the high withstanding voltage diode 30 may further include a P-type isolation well region 107, adjacent to the first and second N-type buried layers 103 and 105 and further doped with other impurities. The P-type isolation well region 107 may be an isolation region, and a P-type doped region 120-1 may be formed in the P-type isolation well region 107. The P-type isolation well region 107 may surround the first and second N-type buried layers 103 and 105.

As illustrated in FIG. 3, the high withstanding voltage diode 30 may further include a P-type source region 120, an N-type drain region 140, and a first P-type body region 130 in the N-type deep well region 110, according to a non-limiting example. The first P-type body region 130 may surround the P-type source region 120. The first P-type body region 130 may serve to increase the breakdown voltage of the PN diode 30. However, in various examples, the first P-type body region 130 may or may not be required, depending on the withstanding voltage of the diode. For example, the first P-type body region 130 may not be used at a low diode withstanding voltage. Thus, the first P-type body region 130 may be an optional region.

According to one or more examples, it may be possible to implement a high withstanding voltage PN diode. The high withstanding voltage diode 30 may be possible because the length of the N-type deep well region 110 existing between the P-type source region 120 and the N-type drain region 140 is very long. Further, because the concentration of the long N-type deep well region 110 is low, it may be advantageous for forming a high withstanding voltage. In such an example, the P-type source region 120 may be referred to as an anode, and the N-type drain region 140 may be referred to as a cathode. When the high withstanding voltage diode 30 is turned on, electron carriers may flow from the P-type source region 120 to the N-type drain region 140.

However, when a high positive voltage, for example, 600V, is applied to the N-type drain region 140, the PN diode 30 is used to block current flowing from the N+ drain region 140 into the P+ source region 120 in order to protect the logic device disposed in the low voltage region 10. When the high positive voltage is applied to the N-type drain region 140, a potential of the P-type source region 120 may also increase, accordingly. There may be a potential difference between the P-type substrate 101 and P-type source region 120. Due to the potential difference, the pinch-off region 113 having a dip 113d may turn into a depletion region. The result is that a high potential barrier may be created, thus preventing current from flowing through the PN diode 30. The current flow may be stopped by the pinch-off region 113. Thus, the PN diode 30 may be able to protect the logic device disposed in low voltage region 10 from the high potential of the drain region, which may have a value such as 600V.

A breakdown voltage of the PN diode 30 is to be higher than the pinch-off voltage, because the PN diode is designed to withstand current until the pinch-off region 113 completely turns into the depletion region. According to the present non-limiting examples, a bottom surface of the pinch-off region 113 may be curved, so the PBL 180 and the substrate 101 may be very close with each other, and the channel region between the PBL 180 and the substrate 101 may be easily pinched-off.

The P-type source region 120 and the N-type drain region 140 may be connected to the source terminal 122 and the drain terminal 142, respectively. The source terminal 122 and the drain terminal 142 may be formed in a form of a contact plug, according to a non-limiting example. In such a non-limiting example, according to the bootstrap circuit, the drain terminal 142 may be electrically connected to a capacitor of a bootstrap structure.

As illustrated in FIG. 3, the high withstanding voltage diode 30 may have an insulating film 150 formed between the source region and the drain region. The insulating film 150 may be formed by a Local Oxidation of Silicon (LOCOS) process or a Shallow Trench Isolation (STI) process, according to non-limiting examples. Another insulating film 151 may be formed between the P-type source region 120 and the P-type doped region 120-1, according to such examples. Also, additional insulating films 152 and 153 may be further formed for electrical isolation from peripheral devices.

As illustrated in FIG. 3, the high withstanding voltage diode 30 may further include a polysilicon field plate 250 formed on the insulating film 150. The polysilicon field plate 250 and the drain terminal 142 may be electrically connected through the drain metal wiring 280. The polysilicon field plate 250 may also reduce a high electric field that starts from the drain region 140.

As illustrated in FIG. 3, the high withstanding voltage diode 30 may further include metal wirings 260 and 280 that are connected to the source terminal 122 and the drain terminal 142, respectively. The metal wirings 260 and 280 may also serve as a field plate. This approach is made possible because the corresponding metal wirings 260 and 280 may be formed to extend over the insulating film 150. In the reverse bias state, this structure may serve to alleviate the high electric field across the N-type deep well region 110 formed between the drain-source terminal. The source metal wiring 260 or the source field plate 260 connected to the source terminal 122 may be connected to a ground power source. In addition, the drain metal wiring 280 or the drain field plate 280 may be connected to a drain power. The plurality of field plates 260 and 280 may be disposed to overlap the first N-type deep well region 111 and the second N-type deep well region 112, respectively.

Figure 4:
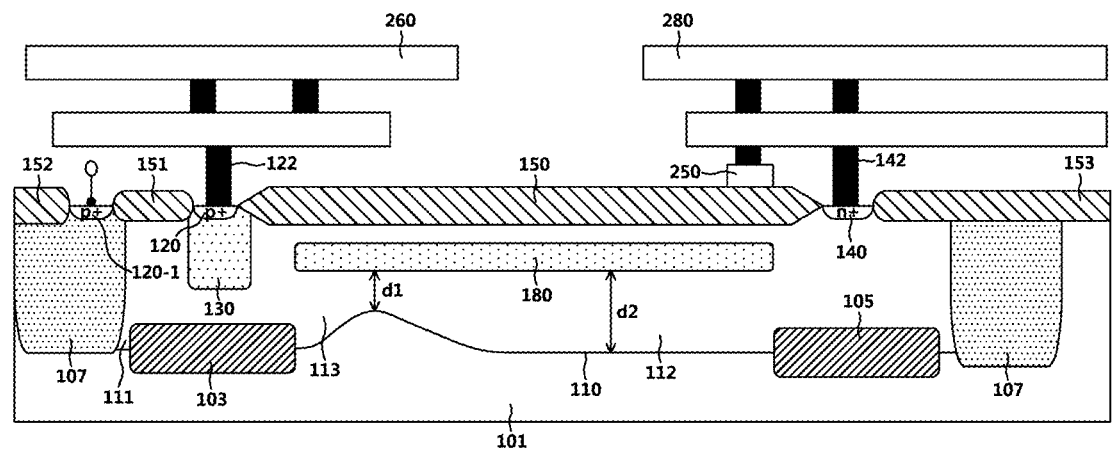
FIG. 4 is a cross-sectional view of a diode, according to one or more examples.

FIG. 4 is a cross-sectional view of a diode, according to one or more examples.

The diode structure of FIG. 4 shows an example where the pinch-off region 113 is very narrow, compared to that of FIG. 3. The distance between the PBL 180 and the substrate 101 may be shortened to have a low pinch-off voltage, and the pinch-off region may be narrowed, thereby reducing the amount of forward current. In FIG. 4, the pinch-off region 113 may have a depth or thickness d1 with respect to the P-type buried layer 180, hereinafter, PBL. In such an example, d1 may denote the shortest distance between the PBL 180 and the substrate 101. The distance d1 between the PBL 180 and the substrate 101 illustrated in FIG. 3 is greater than the distance d1 between the PBL 180 and the substrate 101 illustrated in FIG. 4. Therefore, the diode structure illustrated in FIG. 3 may be regarded as having a greater pinch-off voltage than the diode structure illustrated in FIG. 4. In addition, because the diode structure illustrated in FIG. 3 has a larger area of the pinch-off region 113 than the diode structure illustrated in FIG. 4, there may be a greater amount of current flowing into the drain region. By adjusting the distance d1 between the PBL 180 and the substrate 101 in this manner, various pinch-off voltage values and current amounts desired by the customer may be implemented, accordingly. That is, the depth or thickness d1 of the pinch-off region 113 may be formed differently according to the pinch-off voltage of the desired diode. Also, d2 may be the depth of the second N-type deep well region 112. With respect to the PBL 180, the depth d2 of the second N-type deep well region 112 may be greater than the depth d1 of the diffusion region 113.

Figure 5:
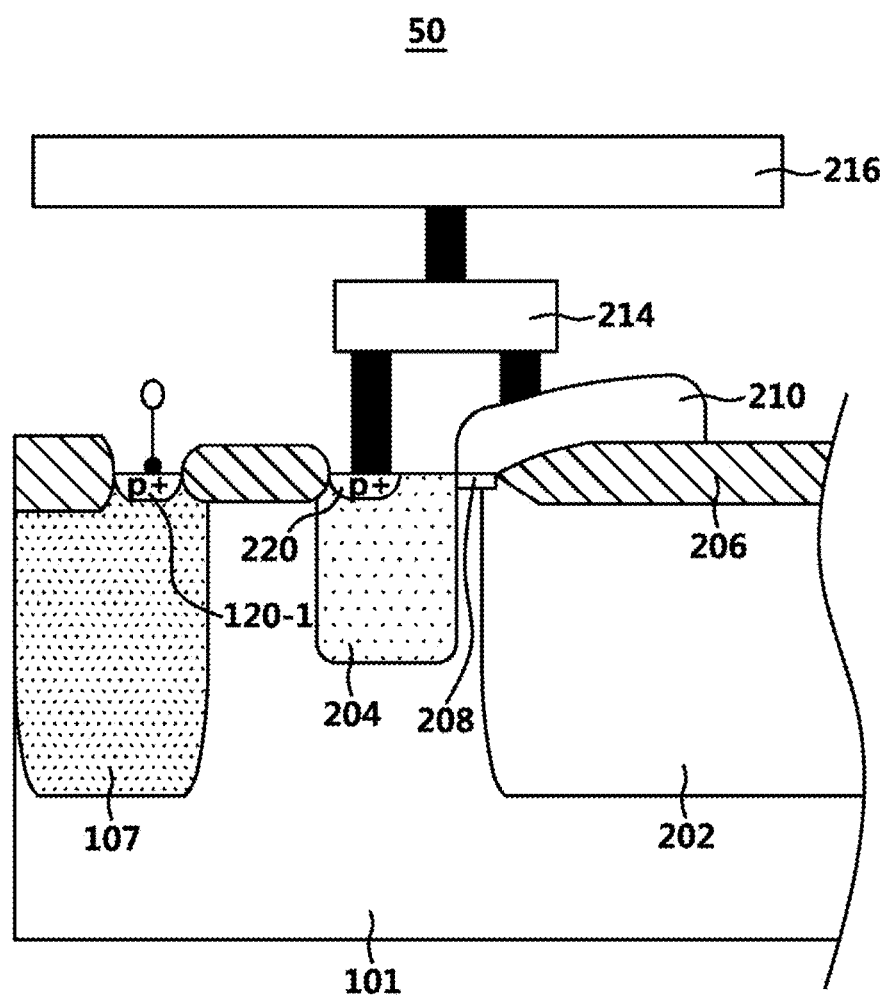
FIG. 5 is a cross-sectional view of a junction isolation region, according to one or more examples.

FIG. 5 is a cross-sectional view taken along line C-D of FIG. 1, according to one or more examples. It may also be regarded as the cross-section of the junction isolation region of FIG. 1.

As illustrated in FIG. 5, the junction isolation region 50 may include a P-type isolation well region 107, a second P-type body region 204, and a P-type doped region 220 formed on the substrate 101. In such an example, the second P-type body region 204 may be formed near the P-type isolation well region or may also be formed to be in contact with the P-type isolation well region. Further, when the substrate 101 also uses a P-type substrate, the P-type isolation well region 107, the second P-type body region 204, and the P-type doped region 220 may all be electrically connected to each other. The junction isolation region 50 may be a region composed of a P-type dopant. Additionally, a high voltage well region 202, a field oxide layer 206, a gate insulating film 208, and a gate electrode 210 may be formed on the substrate, according to a non-limiting example. In such a non-limiting example, the gate electrode 210, the P-type doped region 220, and the second P-type body region 204 may be electrically connected to each other through the metal wiring 214. Therefore, the gate electrode 210 may not act as a gate electrode but instead acts as a field plate in order to alleviate an electric field by being connected to a source power, such as a ground power source. The gate electrode 210 may be formed to overlap the high voltage well region 202 belonging to the high voltage region. In addition, the metal wiring 216 connected to the source power may also serve as a field plate. This structure is possible because the metal wiring 216 may be formed to extend to the high voltage well region 202 belonging to the high voltage region.

Figure 6:
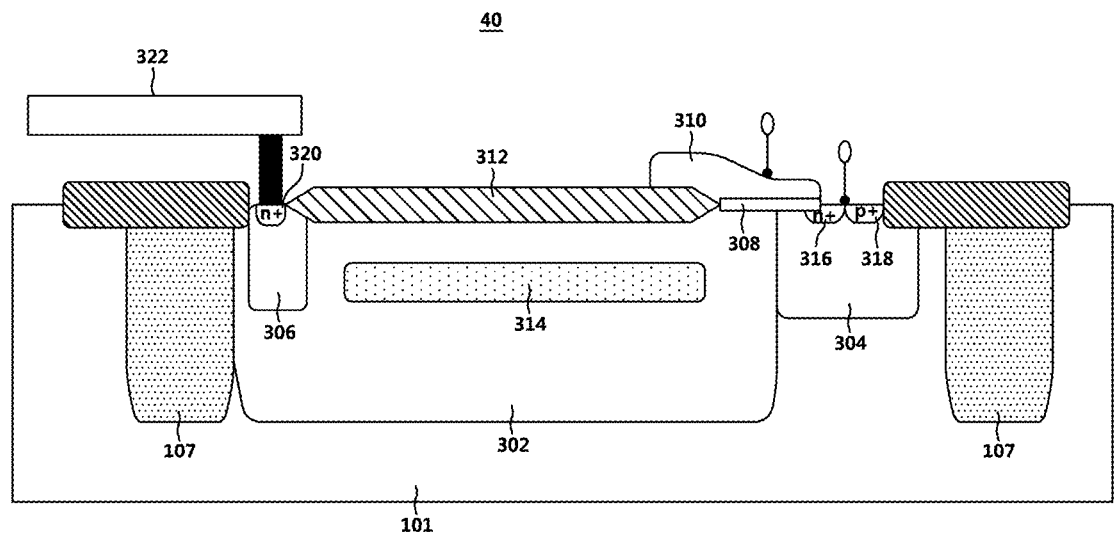
FIG. 6 is a cross-sectional view of an LDMOS device, according to one or more examples.

FIG. 6 is a cross-sectional view taken along line E-F of FIG. 1, and may be regarded as a cross-sectional view of an LDMOS device, according to one or more examples.

As illustrated in FIG. 6, the LDMOS device 40 used as a level shifter may include an N-type deep well region 302, a third P-type body region 304, an N-type well region 306, a gate insulating film 308, a gate electrode 310, a field oxide film 312, a P-type buried layer 314, an N-type source region 316, a P-type pickup region 318, an N-type drain region 320 and a metal wiring 322 formed on the substrate 101, according to a non-limiting example. The LDMOS device 40 may be surrounded by a P-type isolation well region 107. Leakage current from the LDMOS device 40 to the high voltage region 20 may also be blocked by the P-type isolation well region 107.

Figure 7:
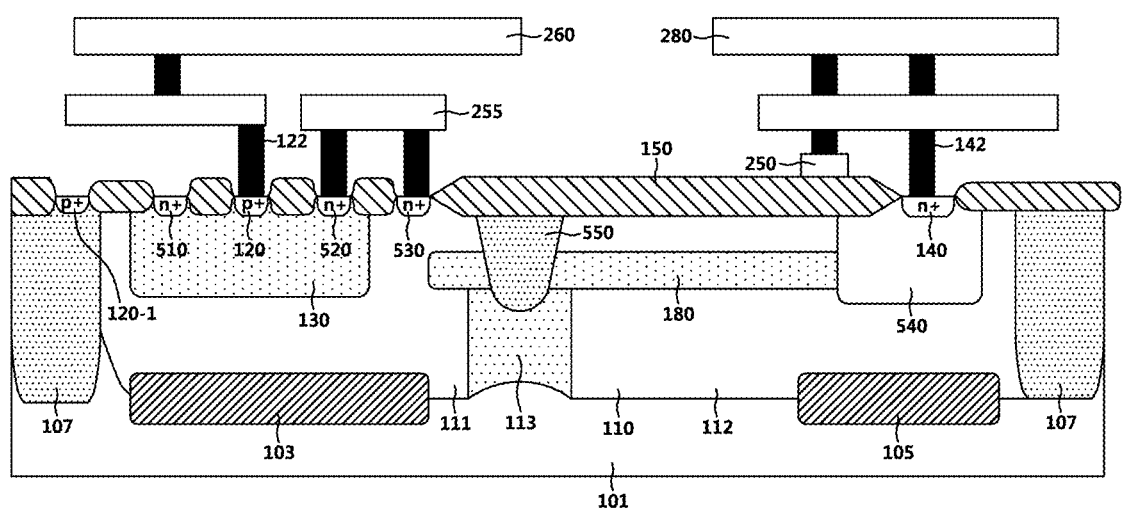
FIGS. 7 to 12 are cross-sectional views of a high withstanding voltage diode, according to one or more examples.

FIG. 7 is another example of cross-sectional view of a high withstanding diode for increasing the amount of current with respect to that of the diode structures described above, according to one or more examples. As illustrated in FIG. 7, the area of the first P-type body region 130 may be increased compared to that of other examples. The larger the area of the first P-type body region 130, the more current may flow. First and second N-type doped regions 510 and 520 may be formed together with the P-type source region 120 in the first P-type body region 130. Additionally, a third N-type doped region 530 may be formed in the N-type deep well region 110. The first N-type doped region 510, the second N-type doped region 520, and the third N-type doped region 530 may be electrically connected to each other by a metal wiring 255. Therefore, the forward current may form two paths. That is, a first path, in which the current flows directly to the N-type deep well region 110 starting from the P-type source region 120, and a second path, in which current flows into the second N-type doped region 520, the metal wiring 255, the third doped region 530 and the N-type deep well region 110 may each be formed.

In addition, an N-type well region NW 540 may be formed to surround the N-type drain region 140. The NW 540 may be formed to reduce the resistance of the entire current path, thereby increasing the amount of current. For example, NW 540 may contact one end of the P-type buried layer 180.

A P-type gate region 550 may be formed to pass through the P-type buried layer 180. The P-type gate region 550 may also have the same depth as the first P-type body region 130 and the N-type well region 540. Thus, the P-type gate region 550 may control a depth of the pinch-off region 113. As a result, the pinch-off voltage may depend on the depth of the P-type gate region 550. As the depth of the P-type gate region 550 increases, the pinch-off region may become narrow. Then, the pinch-off voltage of the PN diode may drop down. In such a non-limiting example, the P-type gate region 550 and the pinch-off region 113 may be formed to overlap each other. The pinch-off region 113 may overlap the P-type gate region 550, the PBL 180, and the field oxide film or insulating film 150.

Figure 8:
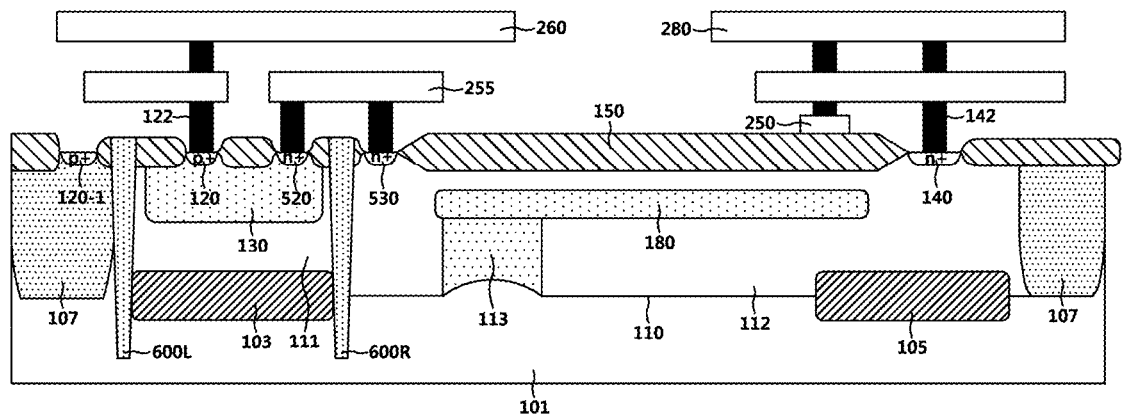

FIG. 8 illustrates that isolation regions 600L and 600R having a deep trench structure may be formed to surround the first P-type body region 130, according to one or more examples. The NBL 103 may exist between the isolation regions 600L and 600R. Because the isolation regions 600L and 600R have the deep trench structure, the bootstrap diode may produce a higher withstanding voltage, accordingly. This result may occur because P-type source region 120 and P-type body region 130 may be completely surrounded by the isolation regions 600L and 600R having the deep trench structure. The isolation regions 600L and 600R may be formed to extend from a top surface of the substrate into a portion of the substrate 101 under the NBL 103. In such a non-limiting example, the current path may flow from the P-type source region 120 into the N-type drain region 140 through the second N-type doped region 520, the metal wiring 255, the third doped region 530, the N-type deep well region 110.

Figure 9:
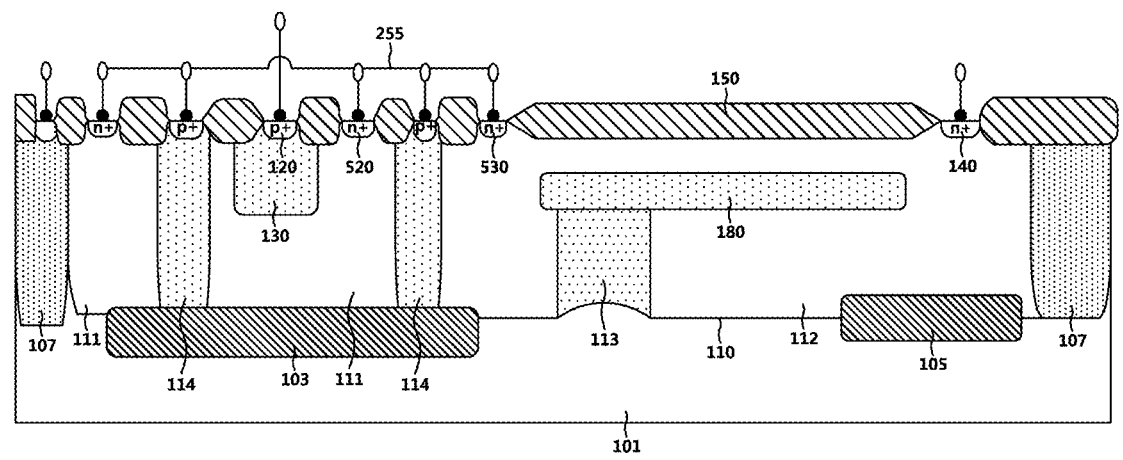

FIG. 9 illustrates isolating a high withstanding voltage diode, according to one or more examples.

Instead of a deep trench structure, a P-type junction isolation well region 114 may be included in FIG. 9. The P-type junction isolation well region 114 may be in contact with the NBL 103. By including the P-type junction isolation well region 114, the bootstrap diode may thereby form a higher withstanding voltage. A P+ region may be formed in the P-type junction isolation well region 114. In addition, a N+ region may be formed at a left end of the first N-type deep well region 111. Therefore, as illustrated in FIG. 9, except for the P-type source region 120, the N+ region and the P+ region of FIG. 9, the second N-type doped region 520 and the third doped region 530 may all be electrically connected to each other by a metal wiring 255. Therefore, the current path may start from the P-type source region 120 and may flow into the N-type drain region 140, also flowing through the second N-type doped region 520, the metal wiring 255, the third doped region 530, and the N-type deep well region 110.

Figure 10:
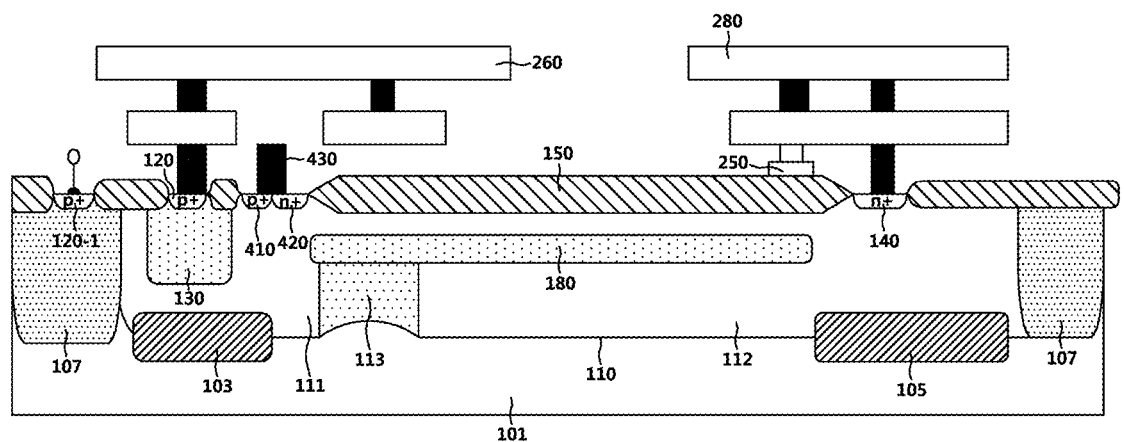

As illustrated in FIG. 10, according to one or more examples, the semiconductor device may include a P-type doped region 410 and an N-type doped region 420 that are in contact with each other. In such examples, the P-type doped region 410 and the N-type doped region 420 may be formed in the N-type deep well region 110. A floating metal wiring 430 may be formed on the P-type doped region 410 and the N-type doped region 420. Because of the floating metal wiring 430, electrons or holes drifting on the substrate may be absorbed accordingly, thereby reducing leakage current or noise.

Figure 11:
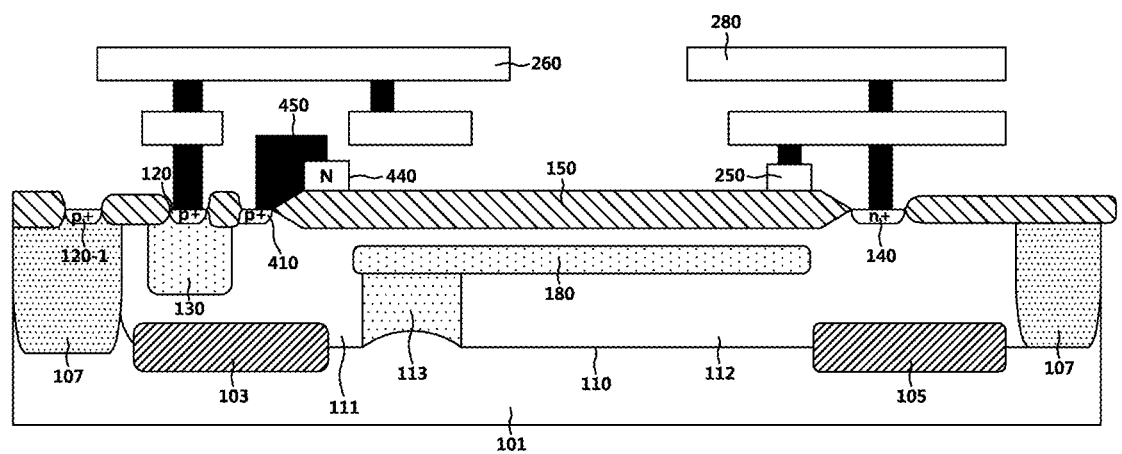

In FIG. 11, by comparison to FIG. 10, according to one or more examples, a P-type doped region 410 may be formed in an N-type deep well region 110, and an N-type polysilicon 440 may be formed on an insulating film 150 adjacent to the P-type doped region 410, and a floating metal wiring 450 connecting the P-type doped region 410 and the N-type poly-silicon or Poly-Si 440 may be included. The N-type doped region 420 of FIG. 10 may be transformed into a N-type polysilicon structure in FIG. 11. As described above, there may be an effect similar to the examples of FIG. 10 in the examples of FIG. 11. That is, because of the floating metal wiring 450, electrons or holes drifting on the substrate may be absorbed, thereby reducing leakage current or noise.

Figure 12:
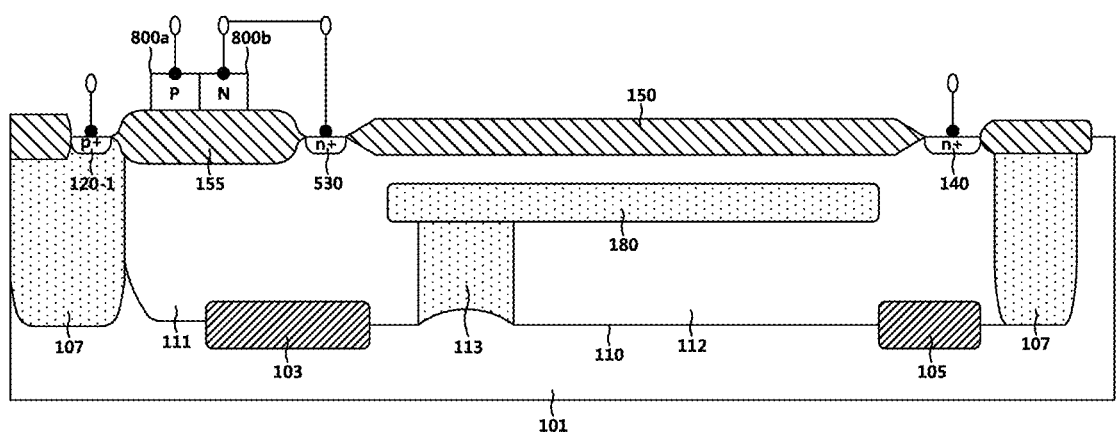

FIG. 12 illustrates a high withstanding voltage diode, according to one or more examples. As illustrated in FIG. 12, the high withstanding diode 30 may include an N-type deep well region 110 including a first N-type deep well region 111, a second N-type deep well region 112 and a pinch-off region 113, a P-type isolation well region 107, a P-type doped region 120-1, an N-type drain region 140, and a PBL 180, according to such a non-limiting example. An isolation film 155 may be formed on the first N-type deep well region 111. In addition, a P-type polysilicon 800a and an N-type polysilicon 800b of a predetermined size may also be formed on the isolation film 155. The P-type polysilicon 800a and the N-type polysilicon 800b may be formed to be in contact with each other. In addition, the N-type doped region 530 and the N-type polysilicon 800b formed in the N-type deep well region 110 may be electrically connected to each other.

As such, the high withstanding voltage diode 30 may be formed of PN polysilicon structures 800a and 800b, rather than PN junction diodes. In this manner, there is no need to form a deep trench structure or doped isolation region that is required for high voltage PN junction diodes.

Figure 13:
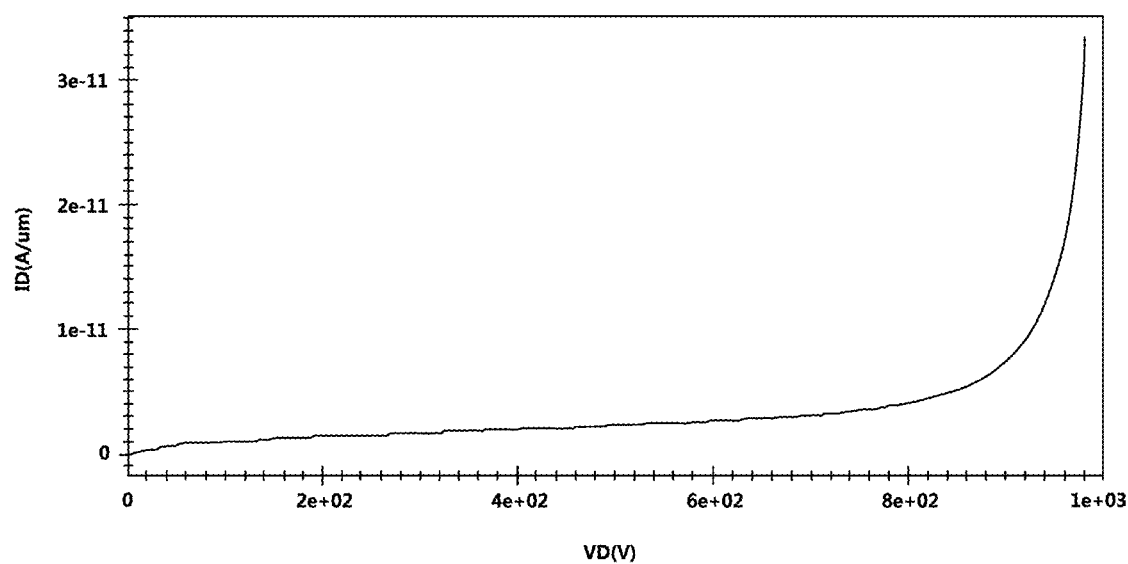
FIG. 13 is a breakdown voltage graph according to operation of a high voltage diode, according to one or more examples.

FIG. 13 is a withstanding voltage graph according to operation of a semiconductor device, according to one or more examples.

The high withstanding voltage diode according to one or more examples may have a breakdown voltage of 900 V or more. In addition, the leakage current is maintained at a very low level of 1e–11 A/um or less, as shown in the graph.

Figure 14:
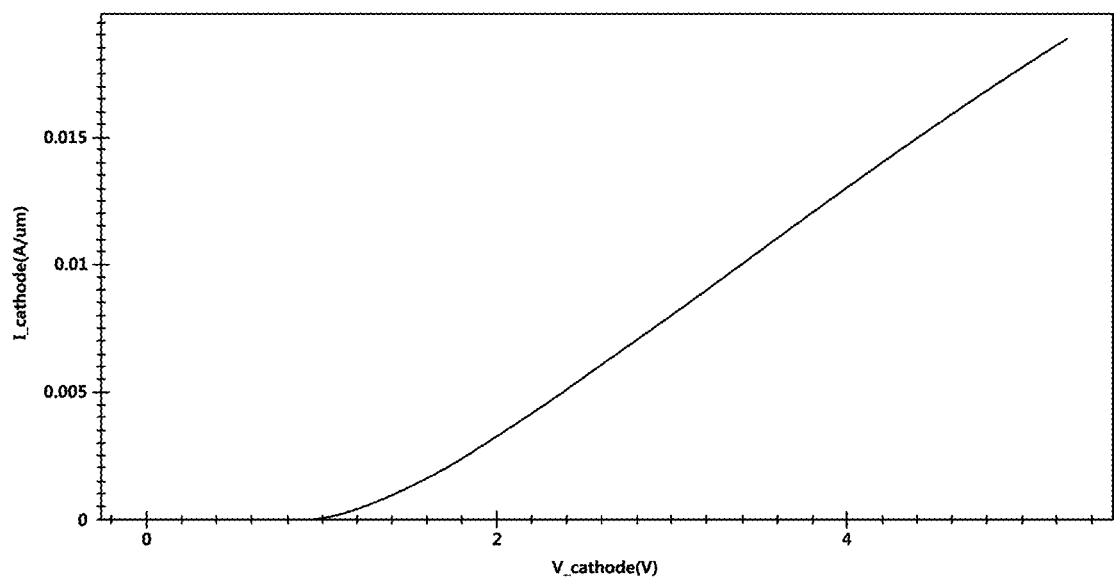
FIG. 14 is a voltage-current graph of a high withstanding voltage diode, according to one or more examples.

FIG. 14 is a voltage-current graph of a semiconductor device, according to one or more examples.

The voltage-current graph of FIG. 14 is a graph illustrative of when a forward bias (+) is applied to the P-type source region 120. The current may increase continuously when such a forward bias is applied. The path of the current may be formed from the P-type source region 120 into the N-type drain region 140, while passing through the N-type deep well region 110. Therefore, the current charges the capacitor having a bootstrap structure.

According to the semiconductor device having the high withstanding diode, according to one or more examples as described above, it may be possible to implement a PN diode that is capable of withstanding a high withstanding voltage by forming a P-type doped region in the source region of the existing JFET structure.

According to the present examples, it may be possible to obtain a pinch-off voltage for various voltage ranges by adjusting the depth of the pinch-off region formed by the diffusion of the first well region and the second well region formed on the substrate.

While this disclosure comprises specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
a source region and a drain region formed in a substrate and having different conductivity types;
an insulating film formed between the source region and the drain region;
a deep well region formed under the insulating film; and
a pinch-off region formed under the insulating film and having a same conductivity type as the deep well region,
wherein a depth of a bottom surface of the pinch-off region is different from a depth of a bottom surface of the deep well region.

2. The semiconductor device of claim 1, wherein the pinch-off region is formed to be in contact with the deep well region,
wherein an amount of current between the source region and the drain region is adjusted based on a form of the pinch-off region, and
wherein the depth of the bottom surface of the pinch-off region is smaller than the depth of the bottom surface of the deep well region.

3. The semiconductor device of claim 1, wherein a dopant concentration of the pinch-off region is smaller than a dopant concentration of the deep well region.

4. The semiconductor device of claim 1, wherein the source region has a P-type conductivity type, and the drain region has an N-type conductivity type, such that the source region and the drain region form a PN diode.

5. The semiconductor device of claim 4, further comprising:
a body region surrounding the source region; and
an isolation well region surrounding the PN diode.

6. The semiconductor device of claim 5, further comprising:
first and second N-type doped regions formed in the body region, and a third N-type doped region formed in the deep well region,
wherein the second N-type doped region and the third N-type doped region are electrically connected to each other.

7. The semiconductor device of claim 5, further comprising:
first and second deep trench structures surrounding the body region.

8. The semiconductor device of claim 5, further comprising:
first and second isolation P-type well regions surrounding the body region.

9. The semiconductor device of claim 1, further comprising:
a buried layer having a same conductivity type as a conductivity type of the source region, and formed between the pinch-off region and the insulating film,
wherein a depth of the pinch-off region is smaller than a depth of the buried layer.

10. The semiconductor device of claim 9, further comprising a gate region penetrating the buried layer,
wherein the gate region overlaps the pinch-off region.

11. The semiconductor device of claim 1, further comprising
a first N-type buried layer and a second N-type buried layer, wherein the first N-type buried layer overlaps the source region and the second N-type buried layer overlaps the drain region.

12. The semiconductor device of claim 1, further comprising:
a first field plate connected to the source region and a second field plate connected to the drain region.

13. The semiconductor device of claim 1, further comprising:
a low voltage region and a high voltage region formed in the substrate; and
an LDMOS device formed between the low voltage region and the high voltage region and comprising:
an N-type source region and an N-type drain region formed in the substrate,
a gate electrode formed between the N-type source region and the N-type drain region, and
a P-type body region surrounding the N-type source region.

14. The semiconductor device of claim 1, wherein the deep well region comprises a first deep well region and a second deep well region formed to be spaced apart from each other, and
wherein the pinch-off region is located between the first and second deep well regions.

15. The semiconductor device of claim 1, further comprising:
a P-type doped region and an N-type doped region formed between the source region and the insulating film; and
a floating metal wiring formed on the P-type and the N-type doped regions.

16. The semiconductor device of claim 1, further comprising:
a P-type doped region formed between the source region and the insulating film;
an N-type polysilicon formed on the insulating film; and
a floating metal wiring connecting the P-type doped region and the N-type polysilicon.

17. A semiconductor device, comprising:
a first deep well region and a second deep well region formed in a substrate;
a diffusion region formed between the first and second deep well regions;
a P-type source region formed in the first deep well region;
an N-type drain region formed in the second deep well region; and
a buried layer formed between the P-type source region and the N-type drain region,
wherein the diffusion region is formed under the buried layer, and a depth of a bottom surface of the diffusion region is different from a depth of a bottom surface of the second deep well region formed under the buried layer.

18. The semiconductor device of claim 17, wherein the diffusion region is formed to be in contact with the deep well region,
wherein an amount of current between the P-type source region and the N-type drain region is adjusted by the diffusion region, and
wherein a depth of the diffusion region is smaller than a depth of the second deep well region formed under the buried layer.

19. The semiconductor device of claim 17, wherein a dopant concentration of the diffusion region is smaller than a dopant concentration of the second deep well region.

20. The semiconductor device of claim 17, wherein the P-type source region and the N-type drain region form a PN diode.

21. The semiconductor device of claim 20, further comprising:
a body region surrounding the P-type source region; and
an isolation well region surrounding the PN diode.

22. The semiconductor device of claim 17, further comprising:
an insulating film formed between the P-type source region and the N-type drain region,
wherein a depth of the diffusion region formed under the insulating film is smaller than a depth of the second deep well region formed under the insulating film.

23. The semiconductor device of claim 17, further comprising a gate region penetrating the buried layer, wherein the gate region overlaps the diffusion region.

24. A semiconductor device, comprising:
a source region and a drain region formed in a substrate;
an insulating film formed between the source region and the drain region;
a deep well region formed under the insulating film; and
a pinch-off region formed under the insulating film and having a same conductivity type as the deep well region,
wherein the source region and the drain region have different conductivity types, and
wherein a depth of a bottom surface of the pinch-off region is smaller than a depth of a bottom surface of the deep well region.

25. The semiconductor device of claim 24, wherein the pinch-off region is formed to be in contact with the deep well region, and
wherein an amount of current between the source region and the drain region is adjusted based on a form of the pinch-off region.

26. The semiconductor device of claim 24, wherein a dopant concentration of the pinch-off region is smaller than a dopant concentration of the deep well region.

27. The semiconductor device of claim 24, wherein the source region has a P-type conductivity type, and the drain region has an N-type conductivity type, such that the source region and the drain region form a PN diode.

* * * * *